United States Patent
Li et al.

(10) Patent No.: US 8,582,354 B1
(45) Date of Patent: Nov. 12, 2013

(54) METHOD AND APPARATUS FOR TESTING A RESISTIVE MEMORY ELEMENT

(75) Inventors: Xia Li, San Diego, CA (US); Wah Nam Hsu, San Diego, CA (US); Jung Pill Kim, San Diego, CA (US); Taehyun Kim, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 62 days.

(21) Appl. No.: 13/464,060

(22) Filed: May 4, 2012

(51) Int. Cl.
G11C 11/00 (2006.01)
G11C 7/00 (2006.01)
G11C 11/14 (2006.01)

(52) U.S. Cl.
USPC ............ 365/158; 365/148; 365/171; 365/201

(58) Field of Classification Search
USPC ......................................................... 365/158
See application file for complete search history.

(56) References Cited

U.S. PATENT DOCUMENTS

| 7,057,922 | B2 | 6/2006 | Fukumoto |
| 7,889,547 | B2 | 2/2011 | Sheu et al. |
| 7,936,588 | B2 | 5/2011 | Liu et al. |
| 8,144,507 | B2 * | 3/2012 | Kim et al. ..................... 365/163 |
| 2006/0290387 | A1 | 12/2006 | Gossmann et al. |
| 2011/0235403 | A1 | 9/2011 | Kang |
| 2013/0051124 | A1 * | 2/2013 | Oh et al. ....................... 365/148 |

* cited by examiner

*Primary Examiner* — Son Mai
(74) *Attorney, Agent, or Firm* — Sam Talpalatsky; Nicholas J. Pauley; Joseph Agusta

(57) ABSTRACT

Methods and apparatus for testing a resistive memory element are provided. In an example, an initial test resistor in a resistance network coupled to a first input of a sense amplifier is selected, where the resistive memory element is coupled to a second input of the sense amplifier and an output of the sense amplifier is measured. Another test resistor is selected based on the output of the sense amplifier and both the measuring the output step and the selecting another test resistor step are repeated until the output of the sense amplifier changes. A resistance of the resistive memory element is estimated based on the last test resistor selected, where the selected test resistors and the resistive memory element pass respective currents having substantially similar amplitudes and are coupled to respective access transistors having substantially similar properties.

45 Claims, 7 Drawing Sheets

Stepped waveform applied across R 210

US 8,582,354 B1

METHOD AND APPARATUS FOR TESTING A RESISTIVE MEMORY ELEMENT

FIELD OF DISCLOSURE

This disclosure relates generally to electronics, and more specifically, but not exclusively, to methods and apparatus for testing a resistive memory element.

BACKGROUND

Random access memory (RAM) is a ubiquitous component of modern digital architectures. RAM can be a standalone device, or can be integrated in a device that uses the RAM, such as a microprocessor, microcontroller, application specific integrated circuit (ASIC), system-on-chip (SoC), and other like devices. RAM can be volatile or non-volatile. Volatile RAM loses its stored information whenever power is removed. Non-volatile RAM can maintain its memory contents even when power is removed. Although non-volatile RAM has advantages, such as an ability to retain its contents without applied power, conventional non-volatile RAM has slower read/write times than volatile RAM.

Magnetoresistive Random Access Memory (MRAM) is a non-volatile memory technology having response (read/write) times comparable to volatile memory. MRAM data does not degrade over time and, compared to other PAM technologies. MRAM uses very little power. In contrast to conventional RAM technologies, which store data as electric charges or current flows, MRAM uses magnetic storage elements, such as a magnetic free layer.

Magnetic tunnel junctions (MTJ's) comprise two layers of magnetic material separated by a thin insulator. The magnetization direction of one magnetic layer is fixed and the magnetization direction of the other magnetic layer can be changed by applying a voltage or current to the MTJ. When the magnetization directions of the fixed and the free layers are opposite or antiparallel, the MTJ has a higher resistance than when the magnetization directions of the fixed and free layers are parallel. The resistance of an MTJ can be measured by applying a small read current thereto. The MTJ can represent a digital "0" in one of these magnetic states and to represent a digital "1" in the other state, thus allowing the MTJ to be used as a magnetic memory element in MRAM.

Due in part to fabrication variations, the resistances of MTJs may vary. Thus, it is necessary to measure the resistances of MTJs as part of the fabrication process to ensure that the MTJs meet performance standards.

FIG. 1 depicts a conventional direct analog MTJ resistance measurement technique 100 for testing an MTJ 105 that is coupled in series with an access transistor (T) 110. During testing, a constant voltage (V) is applied across the MTJ 105 and the access transistor 110 at a bit line (b1) 115 and a source line (s1) 120. The access transistor 110 is actuated via a word line (w1) 125 to permit flow of an analog test current (I) 130. The analog test current 130 is measured, and the resistance $(R_{MTJ})$ of the MTJ 105 is calculated as $R_{MTJ}=(V/I)-R_t$, where $R_t$ is the on-resistance of the access transistor 110.

FIG. 2 depicts another conventional direct analog MTJ resistance measurement technique 200 for testing the MTJ 105. As sense amplifier 205 input is coupled to the bit line 115. A reference resistor (R) 210 is coupled as a second input to the sense amplifier 205. During testing, a step waveform 215 is applied to the second input of the sense amplifier 205 across the reference resistor 210. The step waveform 215 can be a stepped voltage having a step $\Delta V_{ref}$ or a stepped current having a step $\Delta I_{ref}$. As the stepped waveform 215 is applied, the number of steps (n) are counted until the output 220 of the sense amplifier 205 changes, at which time the resistance $(R_{MTJ})$ of the MTJ 105 is calculated. The $R_{mtj}=R*n*\Delta I_{ref}/I_{SA}-R_t$ or $R_{mtj}=n*\Delta V_{ref}/I_{SA}-R_t$, where $I_{SA}$ is the current through the MTJ and $\Delta I_{ref}$ and $\Delta V_{ref}$ define the resolution of the direct analog MTJ resistance measurement technique 200.

Problems with conventional testing devices and methods include a testing time that is too long, which results in long test times and reduced foundry throughput. Further, it is difficult for external logic testers to generate an accurate multi-channel analog multi-step waveform during the conventional process.

Accordingly, there are long-felt industry needs for methods and apparatus that improve upon conventional methods and apparatus, including methods and apparatus for testing a resistive memory element.

SUMMARY

This summary provides a basic understanding of some aspects of the present teachings. This summary is not exhaustive in detail, and is neither intended to identify all critical features, nor intended to limit the scope of the claims.

Exemplary methods and apparatus for testing a resistive memory element are provided. An exemplary method includes selecting an initial test resistor in a resistance network coupled to a first input of a sense amplifier. The resistive memory element is coupled to a second input of the sense amplifier. The resistive memory element can be a magnetic tunnel junction (MTJ) in a parallel state or in an anti-parallel state. The resistance network can have a range of resistors with a middle resistor substantially at the center of the range of the plurality of resistors selected as the initial test resistor. The method also includes measuring an output of the sense amplifier to determine a high value or low value, and selecting another test resistor from the resistance network based on the output of the sense amplifier. Further, the method includes repeating the measuring the output of the sense amplifier step and the selecting another test resistor from the resistance network step until the output of the sense amplifier changes. The method also includes estimating a resistance of the resistive memory element based on the last test resistor selected, where the selected test resistors (e.g., the initial test resistor, the "another test resistor," the last test resistor selected, etc.) and the resistive memory element pass respective currents having substantially similar amplitudes and are coupled to respective access transistors having substantially similar properties. The method can also include selecting a remaining range of the resistance network by eliminating substantially half of the range of resistors from consideration in the selecting another test resistor step, based on the output of the sense amplifier, where the another test resistor is selected as a middle resistor in the remaining range of the resistance network, based on the output of the sense amplifier. The resistance network can also include $2^n$ resistors, where n is an integer greater than 1, the initial test resistor is the $2^{n-1}$ resistor, and the middle resistor in the remaining range after the repeating step is (1) the $2^{n-2}$ resistor, if the remaining range includes resistors $2^0$ to $2^{n-1}$ or (2) the $3*2^{n-2}$ resistor, if the remaining range includes resistors $2^{n-1}$ to $2^n$, and the remaining range is $2^0$ to $2^{n-1}$ or $2^{n-1}$ to $2^n$. The selecting the remaining range can also include at least one of: (1) selecting the high end of the remaining range equal to the middle resistor, if the sense amplifier output indicates that the resistance coupled to the first input is too low; and (2) selecting the low end of the remaining range equal to middle resistor, if the sense amplifier output indicates that the resistance coupled to the first input is too high.

In a further example, provided is a non-transitory computer-readable medium, comprising instructions stored thereon that, if executed by a processor, cause the processor to execute at least a part of the aforementioned method. The non-transitory computer-readable medium can be integrated with a device, such as a lithographic apparatus, a mobile device, a music player, a video player, an entertainment unit, a navigation device, a communications device, a personal digital assistant (PDA), a fixed location data unit, and/or a computer.

In another example, provided is an apparatus configured to test a resistance of a magnetic tunnel junction. The apparatus includes means for selecting an initial test resistor in a resistance network coupled to a first input of a sense amplifier. The resistive memory element is coupled to a second input of the sense amplifier. The resistive memory element can be an MTJ in a parallel state or an anti-parallel state. The resistance network can have a range of resistors, with a middle resistor substantially at the center of the range of the plurality of resistors selected as the initial test resistor. The apparatus also includes means for measuring an output of the sense amplifier to determine a high value or low value and means for selecting another test resistor from the resistance network based on the output of the sense amplifier. The apparatus can also include means for repeating actuation of the means for measuring the output of the sense amplifier and the means for selecting another test resistor from the resistance network, until the output of the sense amplifier changes and means for estimating a resistance of the resistive memory element based on the last test resistor selected, where the selected test resistors (e.g., the initial test resistor, the "another test resistor," the last test resistor selected, etc.) and the resistive memory element pass respective currents having substantially similar amplitudes and are coupled to respective access transistors having substantially similar properties. In an example, the apparatus includes means for selecting a remaining range of the resistance network by eliminating substantially half of the range of resistors from consideration by the means for selecting another test resistor based on the output of the sense amplifier, where the another test resistor is selected as a middle resistor in the remaining range of the resistance network, based on the output of the sense amplifier. The resistance network can include $2^n$ resistors, where n is an integer greater than 1, the initial test resistor is the $2^{n-1}$ resistor, and the middle resistor in the remaining range output from the means for repeating is (1) the $2^2$ resistor, if the remaining range includes resistors $2^0$ to $2^{n-1}$ or (2) the $3*2^{n-2}$ resistor, if the remaining range includes resistors $2^{n-1}$ to $2^n$, and the remaining range is $2^0$ to $2^{n-1}$ or $2^{n-1}$ to $2^n$. Furthermore, the means for selecting the remaining range can include at least one of: (1) means for selecting the high end of the remaining range equal to the middle resistor, if the sense amplifier output indicates that the resistance coupled to the first input is too low; and (2) means for selecting the low end of the remaining range equal to middle resistor, if the sense amplifier output indicates that the resistance coupled to the first input is too high.

At least a part of the apparatus can be integrated on a semiconductor die. Further, at least a part of the apparatus can be integrated with a device, such as a lithographic apparatus, a mobile device, a set top box, a music player, a video player, an entertainment unit, a navigation device, a communications device, a personal digital assistant, a fixed location data unit, and/or a computer. In a further example, provided is a non-transitory computer-readable medium, comprising instructions stored thereon that, if executed by a lithographic device, cause the lithographic device to fabricate at least a part of the apparatus.

In another example, provided is an apparatus configured to test a resistance of a magnetic tunnel junction. The apparatus includes a processor configured to select an initial test resistor in a resistance network coupled to a first input of a sense amplifier. The resistive memory element is coupled to a second input of the sense amplifier. The resistive memory element can be an MTJ in a parallel state or in an anti-parallel state. The resistance network can have a range of resistors, and a middle resistor substantially at the center of the range of the plurality of resistors selected as the initial test resistor. The processor is also configured to measure an output of the sense amplifier to determine a high value or low value, and configured to select another test resistor from the resistance network based on the output of the sense amplifier. The processor is further configured to repeat the measuring the output of the sense amplifier step and the selecting another test resistor from the resistance network step, until the output of the sense amplifier changes and configured to estimate a resistance of the resistive memory element based on the last test resistor selected, where the selected test resistors (e.g., the initial test resistor, the "another test resistor," the last test resistor selected, etc.) and the resistive memory element pass respective currents having substantially similar amplitudes and are coupled to respective access transistors having substantially similar properties. In the apparatus, the processor can be further configured to select a remaining range of the resistance network by eliminating substantially half of the range of resistors from consideration in the selecting another test resistor step based on the output of the sense amplifier, and select the another test resistor as a middle resistor in the remaining range of the resistance network, based on the output of the sense amplifier. In another example, the resistance network includes $2^n$ resistors, where n is an integer, the initial test resistor is the $2^{n-1}$ resistor, and the middle resistor in the remaining range after the repeating step is (1) the $2^{n-2}$ resistor, if the remaining range includes resistors $2^0$ to $2^{n-1}$ or (2) the $3*2^{n-2}$ resistor, if the remaining range includes resistors $2^{n-1}$ to $2^n$, and the remaining range is $2^0$ to $2^{n-1}$ or $2^{n-1}$ to $2^n$. Further, the apparatus can be configured to: (1) select the high end of the remaining range equal to the middle resistor, if the sense amplifier output indicates that the resistance coupled to the first input is too low; and/or (2) select the low end of the remaining range equal to middle resistor, if the sense amplifier output indicates that the resistance coupled to the first input is too high.

At least a part of the apparatus can be integrated in a semiconductor die. Further, at least a part of the apparatus can be integrated with a device, such as a lithographic apparatus, a mobile device, a set top box, a music player, a video player, an entertainment unit, a navigation device, a communications device, a personal digital assistant, a fixed location data unit, and/or a computer. In a further example, provided is a non-transitory computer-readable medium, comprising instructions stored thereon that, if executed by a lithographic device, cause the lithographic device to fabricate at least a part of the apparatus.

A further exemplary method for testing a resistive memory element in a resistive memory array includes a step for selecting an initial test resistor in a resistance network coupled to a first input of a sense amplifier. The resistive memory element can be coupled to a second input of the sense amplifier. Further, the resistive memory element can be an MTJ in a parallel state or in an anti-parallel state. The resistance network can have a range of resistors, and a middle resistor substantially at the center of the range of the plurality of resistors that is selected, as the initial test resistor. The method includes a step for measuring an output of the sense amplifier to determine a high value or low value and a step for selecting another test resistor from the resistance network based on the output of the sense amplifier. The method also includes a step for repeating the step for measuring the output of the sense amplifier and the step for selecting another test resistor from the resistance network step until the output of the sense amplifier changes. The method also includes a step for estimating a resistance of the resistive memory element based on the last test resistor selected, where the selected test resistors the initial test resistor, the "another test resistor," the last test resistor selected, etc.) and the resistive memory element pass respective currents having substantially similar amplitudes, and are coupled to respective access transistors having substantially similar properties. Furthermore, the method can include a step for selecting a remaining range of the resistance network by eliminating substantially half of the range of resistors from consideration in the selecting another test resistor step, based on the output of the sense amplifier, where the another test resistor is selected as a middle resistor in the remaining range of the resistance network, based on the output of the sense amplifier. The resistance network can include $2^n$ resistors, where n is an integer greater than −1, the initial test resistor is the $2^{n-1}$ resistor, and the middle resistor in the remaining range after the repeating step is: (1) the $2^{n-2}$ resistor, if the remaining range includes resistors $2^0$ to $2^{n-1}$ or (2) the $3*2^{n-2}$ resistor, if the remaining range includes resistors $2^{n-1}$ to $2^n$, and the remaining range is $2^0$ to $2^{n-1}$ or $2^{n-1}$ to $2^n$. The step for selecting the remaining range further includes at least one of: (1) a step for selecting the high end of the remaining range equal to the middle resistor, if the sense amplifier output indicates that the resistance coupled to the first input is too low; and (2) a step for selecting the low end of the remaining range equal to middle resistor, if the sense amplifier output indicates that the resistance coupled to the first input is too high.

In a farther example, provided is a non-transitory computer-readable medium, comprising instructions stored thereon that, if executed by a processor, cause the processor to execute at least a part of the aforementioned method. The non-transitory computer-readable medium can be integrated with a device, such as a lithographic apparatus, a mobile device, a music player, a video player, an entertainment unit, a navigation device, a communications device, a personal digital assistant, a fixed location data unit, and/or a computer.

The foregoing broadly outlines some of the features and technical advantages of the present teachings in order that the detailed description and drawings can be better understood. Additional features and advantages are also described in the detailed description. The conception and disclosed embodiments can be readily utilized, as a basis for modifying or designing other structures for carrying out the same purposes of the present teachings. Such equivalent constructions do not depart from the technology of the teachings as set forth in the claims. The novel features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

Figure 1:
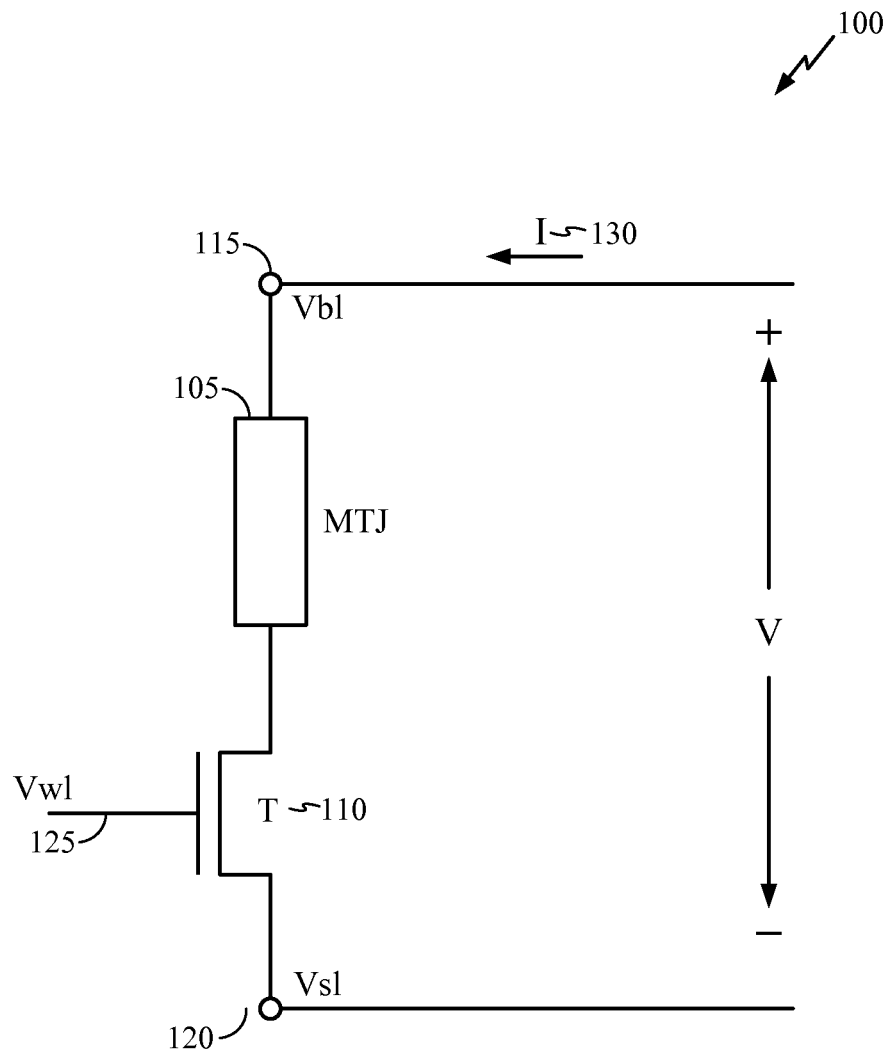
FIG. 1 depicts a conventional direct analog magnetic tunnel junction resistance measurement technique.
Figure 2:
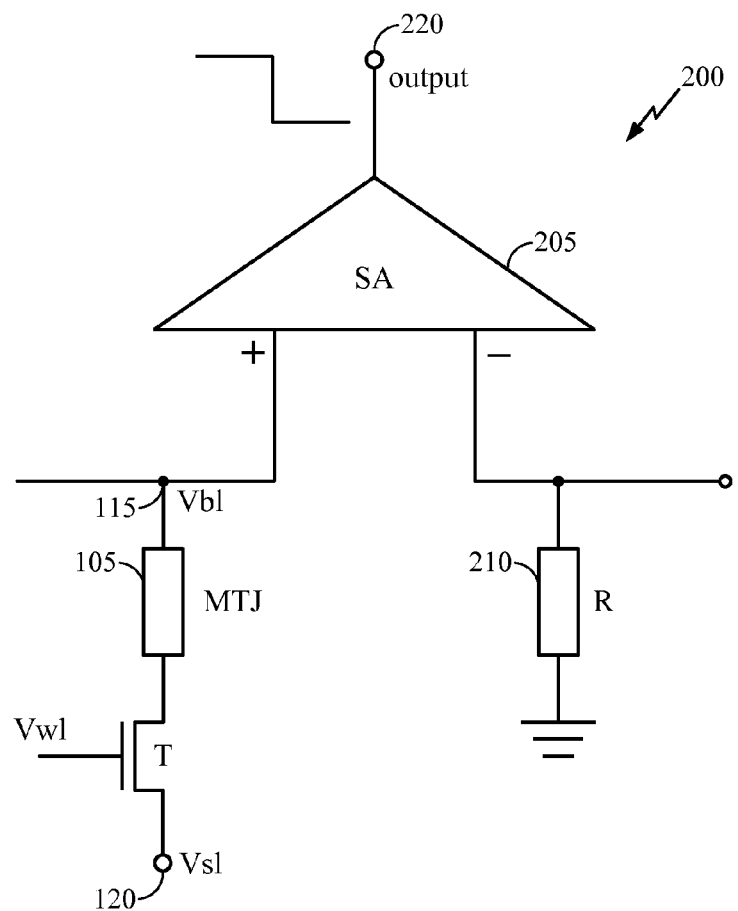
FIG. 2 depicts another conventional direct analog magnetic tunnel junction resistance measurement technique.
Figure 2:
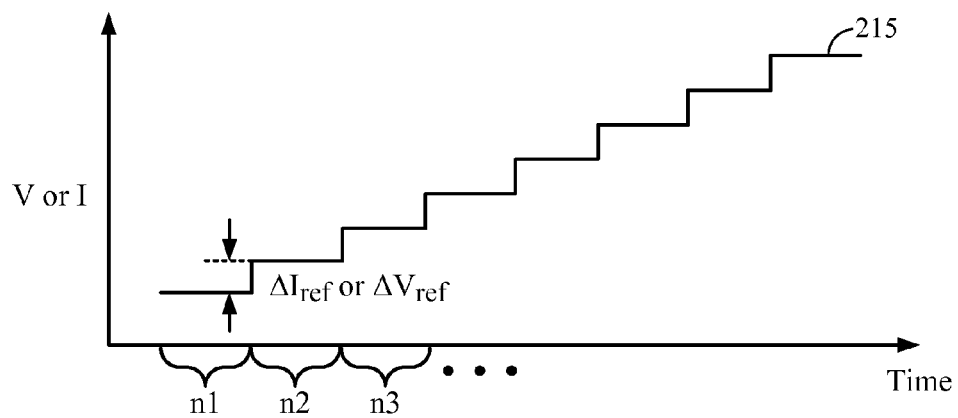

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Introduction

Methods and apparatus are provided for testing a resistive memory element. In an example, a method for testing a resistive memory element in a resistive memory array is provided. The method includes selecting an initial test resistor in a resistance network coupled to a first input (+) of a sense amplifier, where the resistive memory element is coupled to a second input (−) of the sense amplifier and measuring an output of the sense amplifier to determine a high value or low value. In an example, the input signs of the sense amplifier can be reversed and the sense output also can be inverted. Another test resistor is selected from the resistance network based on the output of the sense amplifier and both the measuring the output of the sense amplifier step and the selecting another test resistor from the resistance network step are repeated until the output of the sense amplifier changes. A resistance of the resistive memory element is estimated based on the last test resistor selected, where the selected test resistors the initial test resistor, the "another test resistor," the last test resistor selected, etc.) and the resistive memory element pass respective currents having substantially similar amplitudes and are coupled to respective access transistors having substantially similar properties.

An advantage, provided by the exemplary apparatuses and methods disclosed herein, is an improvement in testing speed over conventional methods and devices. Another advantage is an improvement in throughput during fabrication of resistive memory elements. Another advantage is that the exemplary apparatuses and methods disclosed herein can be used in a self test process (e.g., ATPG, auto test program generator) to profile array MTJ resistance and find tail bits for repair.

Examples of the current teachings are disclosed in this application's text and drawings. The examples advantageously address the long-felt industry needs, as well as other previously unidentified needs, and mitigate shortcomings of the conventional methods and apparatus. Alternate embodiments can be devised without departing from the scope of the invention. Additionally, conventional elements of the current teachings may not be described in detail, or may be omitted, to avoid obscuring aspects of the current teachings.

As used herein, the term "exemplary" means "serving as an example, instance, or illustration," Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures.

It should be noted that the terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As employed herein two elements can be considered to be "connected" or "coupled" together by the use of one or more wires, cables, and/or printed electrical connections, as well as by the use of electromagnetic energy, such as electromagnetic energy having wavelengths in the radio frequency region, the microwave region and/or the optical (both visible and invisible) region, as several non-limiting and non-exhaustive examples.

It should be understood that the term "signal" can include any signal such as a data signal, audio signal, video signal, and/or a multimedia signal. Information and signals can be represented using any of a variety of different technologies and techniques. For example, data, instructions, process step, commands, information, signals, bits, symbols, and/or chips that are referenced in this description can be represented by voltages, currents, electromagnetic waves, magnetic fields or particles, optical fields or particles, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

The terminology used herein is for the purpose of describing particular embodiments only and is not intended to be limiting. As used herein, the singular forms "a," "an," and "the" are intended to include the plural forms as well, unless the context clearly indicates otherwise. Further, the terms "comprises," "comprising," "includes," and "including," when used herein, specify a presence of stated features, integers, steps, operations, elements, and/or components, but do not preclude the presence and/or addition of one or more other features, integers, steps, operations, elements, components, and/or groups thereof.

In the following description, certain terminology is used to describe certain features. The term "mobile device" includes, and is not limited to, a mobile phone, a mobile communication device, a personal digital assistant, a mobile palm-held computer, a wireless device, and/or other types of portable electronic devices typically carried by a person and/or having some form of communication capabilities (e.g., wireless, infrared, short-range radio, etc.).

DESCRIPTION OF THE FIGURES

Figure 3:
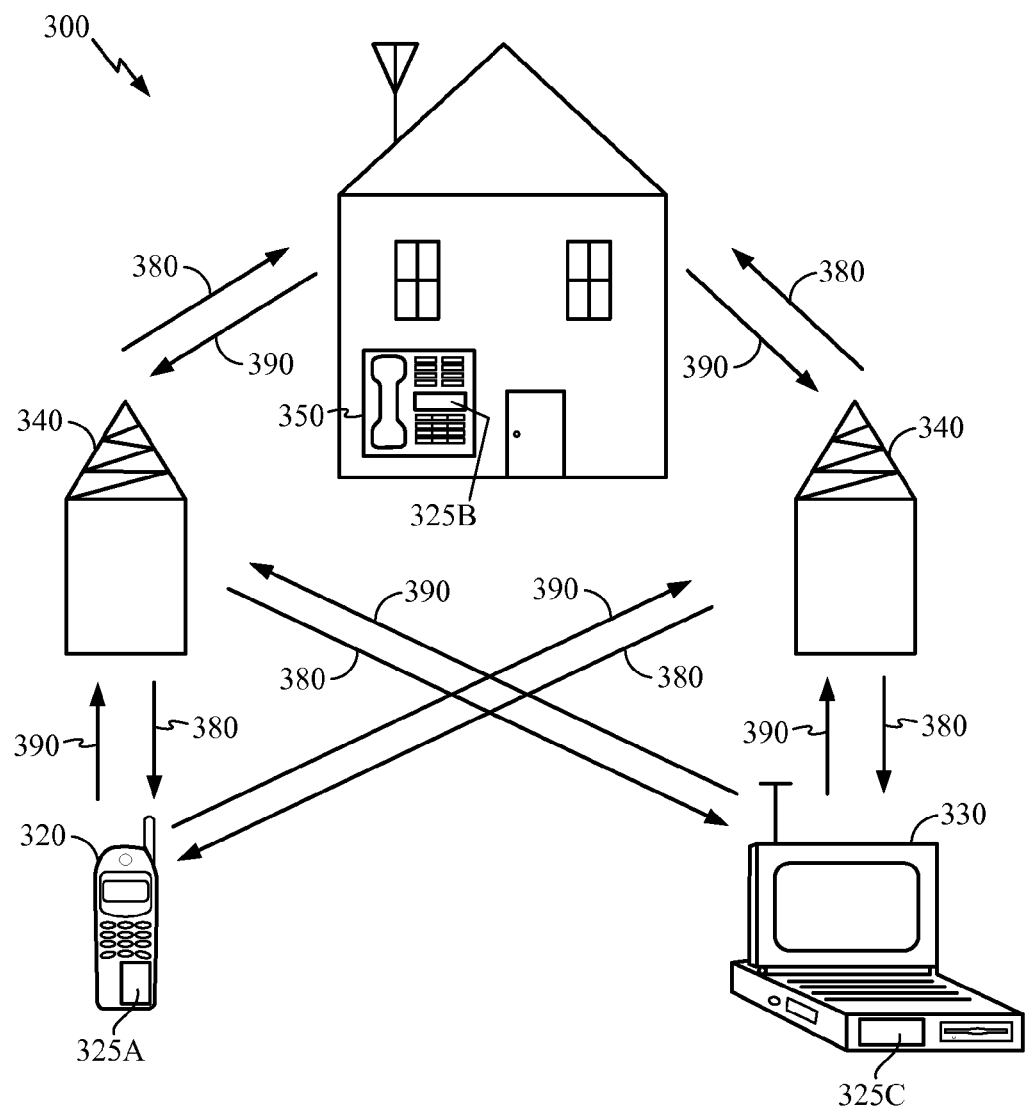
FIG. 3 depicts an exemplary communication system in which an embodiment of the disclosure may be advantageously employed.

FIG. 3 depicts an exemplary communication system 300 in which an embodiment of the disclosure may be advantageously employed. For purposes of illustration, FIG. 3 shows three remote units 320, 330, and 350 and two base stations 340. The wireless communication system 300 can have many more remote units and more base stations. The remote units 320, 330, and 350 include at least a part of an embodiment 325A-C of the disclosure as discussed further herein. FIG. 3 also shows forward link signals 380 from the base stations 340 and the remote units 320, 330, and 350, as well as reverse link signals 390 from the remote units 320, 330, and 350 to the base stations 340.

In FIG. 3, the remote unit 320 is shown as a mobile telephone, the remote unit 330 is shown as a portable computer, and the remote unit 350 is shown as a fixed location remote unit in a wireless local loop system. In examples, the remote units 330 may be a mobile phone, a hand-held personal communication systems (PCS) unit, a portable data unit such as a personal data assistants, a GPS-enabled device, a navigation device, a settop box, a music player, a mobile device, a video player, an entertainment units, or any other device that stores or retrieves data or computer instructions, or any combination thereof. Although FIG. 3 illustrates remote units according to the teachings of the disclosure, the disclosure is not limited to these exemplary illustrated units. Embodiments of the disclosure can be suitably employed in any device which includes active integrated circuitry including MRAM memory and on-chip circuitry for test and characterization.

Figure 4:
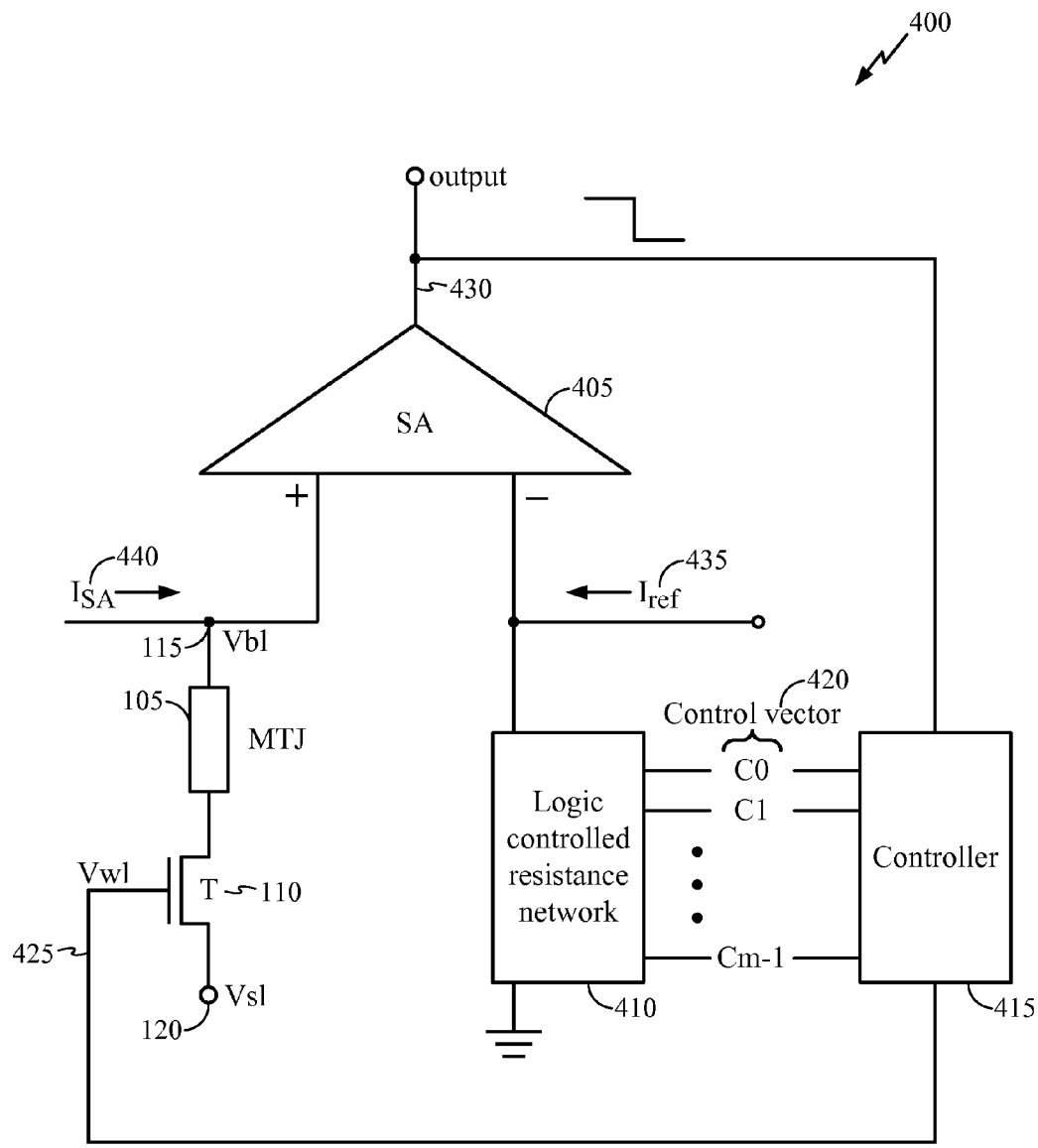
FIG. 4 depicts an exemplary logic-controlled resistance network circuit for improved magnetic tunnel junction resistance measurement.

FIG. 4 depicts an exemplary logic-controlled resistance network circuit 400 for improved MTJ resistance measurement. The logic-controlled resistance network circuit 400 includes a sense amplifier 405 coupled to the bit line 115. A logic-controlled resistance network 410 is coupled as a second input to the sense amplifier 405. The logic-controlled resistance network 410 can provide linear or non-linear changes in resistance. A controller 415 is coupled to provide a control vector 420 to the logic-controlled resistance network 410 and control a write line 425. An output 430 of the sense amplifier 405 is coupled to the controller 415.

During testing to determine the resistance ($R_{MTJ}$) of the MTJ 105, the controller 415 generates the control vector 420 having "m" digital control signals ($C_0, C_1, \ldots, C_{m-1}$). The control vector 420 controls the resistance of the logic-controlled resistance network 410. In an example, the control vector 420 can cause the logic-controlled resistance network 410 to sequentially change the resistance ($R_{network}$) of the logic-controlled resistance network 410 by equal amounts for each equal transition in the control vector 420. In another example, the control vector 420 can cause the logic-controlled resistance network 410 to change the resistance ($R_{network}$) of the logic-controlled resistance network 410 by different amounts for each equal transition in the control vector 420. The resolution to which RMTJ can be measured is determined by the minimum resistance step provided by the logic-controlled resistance network 410.

A reference current $I_{ref}$ 435 is passed through the logic-controlled resistance network 410 to provide a voltage at the second input to the sense amplifier 405. A sense amplifier current $I_{SA}$ 440 is passed through the MTJ 105 and the access transistor 110. The output 430 of the sense amplifier 405 transitions low-to-high or high-to-low when $I_{ref}*(R_{network})$ substantially equals $I_{SA}*(R_{MTJ}+R_t)$, where $R_{network}$ is the resistance of the logic-controlled resistance network 410 selected by the control vector 420 and $R_t$ is the on-resistance of the access transistor 110. In an example, $I_{SA}=I_{ref}$. Once the $R_{network}$ at which the sense amplifier 405 transitions has been determined, the resistance ($R_{MTJ}$) of the MTJ 105 is calculated as $R_{MTJ}=R_{network}-R_t$ because $R_{network}$ uses same size access transistor of MTJ and access transistor resistance will be equal to each other if current is same.

Figure 5:
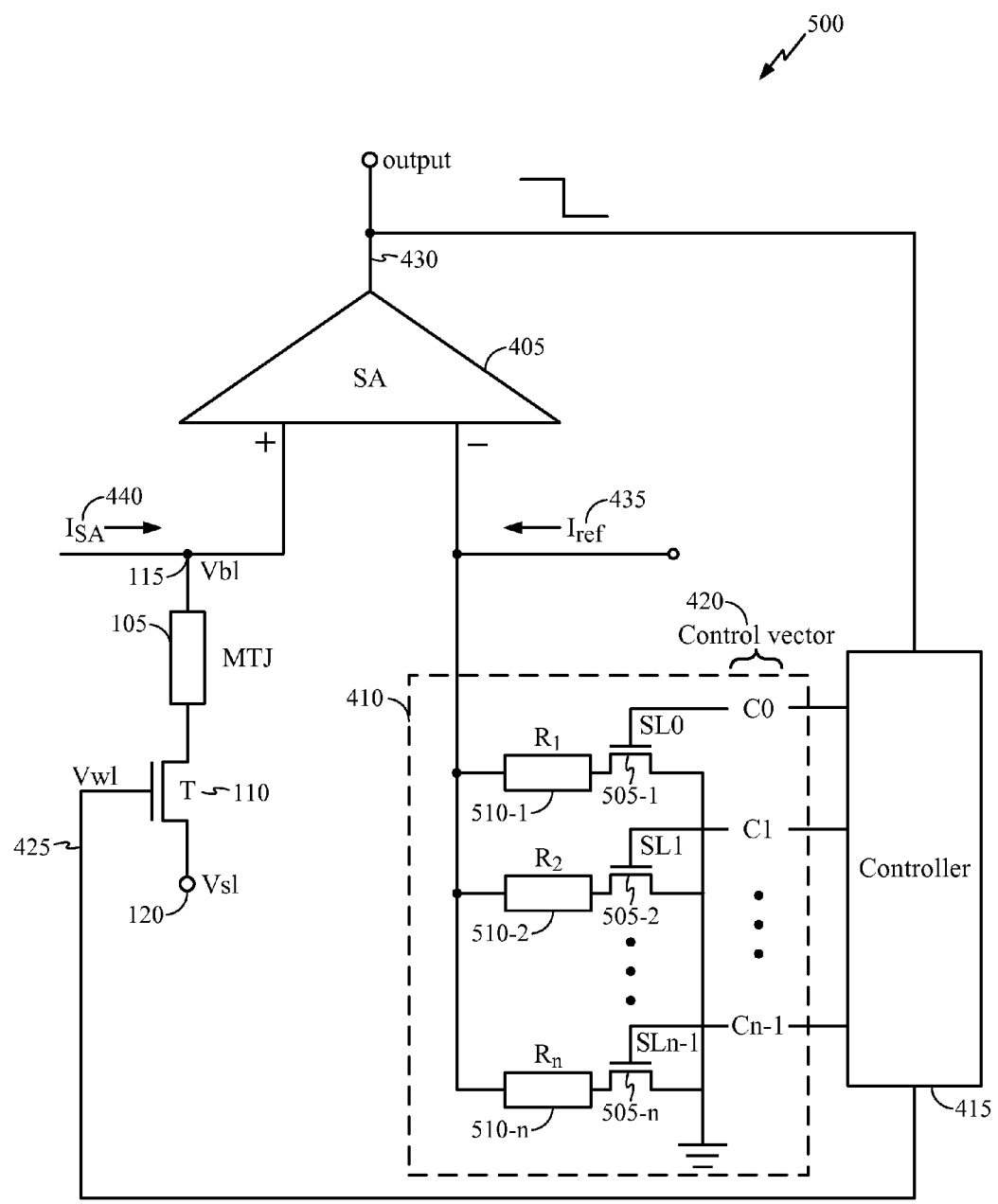
FIG. 5 depicts an exemplary logic-controlled resistance network circuit for improved magnetic tunnel junction resistance measurement.

FIG. 5 depicts an exemplary logic-controlled resistance network circuit 500 for improved MTJ resistance measurement. The logic-controlled resistance network circuit 500 includes the sense amplifier 405 coupled to the bit line 115. The logic-controlled resistance network 410 is coupled as the second input to the sense amplifier 405. The logic-controlled resistance network 410 includes a plurality of control gates $SL_0, SL_1, \ldots, SL_{n-1}$ (505-1 to 505-$n$) that actuate respective resistors $R_1, R_2, \ldots$ (510-1 to 510-$n$). In an example, the difference in resistance between numerically subsequent resistors (e.g., $R_1$ and $R_2$) is a fixed resistance. In another example, the difference in resistance between numerically subsequent resistors is a function (e.g., a multiple) of the numerically lower resistor resistance. For example, $R_2=2R_1$. As a further example, $R_2=(R_1)^2$. The control gates 505-1 to 505-$n$ have substantially similar parameters (e.g., transistor width/length) as the access transistor 110. Thus, in an example, the control gates 505-1 to 505-$n$ have an on-resistance substantially similar to that of the access transistor 110.

During testing to determine the resistance ($R_{MTJ}$) of the MTJ 105, the controller 415 generates the control vector 420 on "n" lines ($SL_0$ to $SL_{n-1}$), which in turn controls the resistance of the logic-controlled resistance network 410. The control gates 505-1 to 505-$n$ can be actuated individually or in unison until the output 430 of the sense amplifier 405 transitions low-to-high or high-to-low. Calculation of the resistance ($R_{MTJ}$) of the MTJ 105 is as described with respect to FIG. 4. When $I_{SA}=I_{ref}$, access transistor resistance $R_t$ can be canceled by resistance network access transistor if both transistors are the same size (e.g., have similar W/L dimensions).

Figure 6:
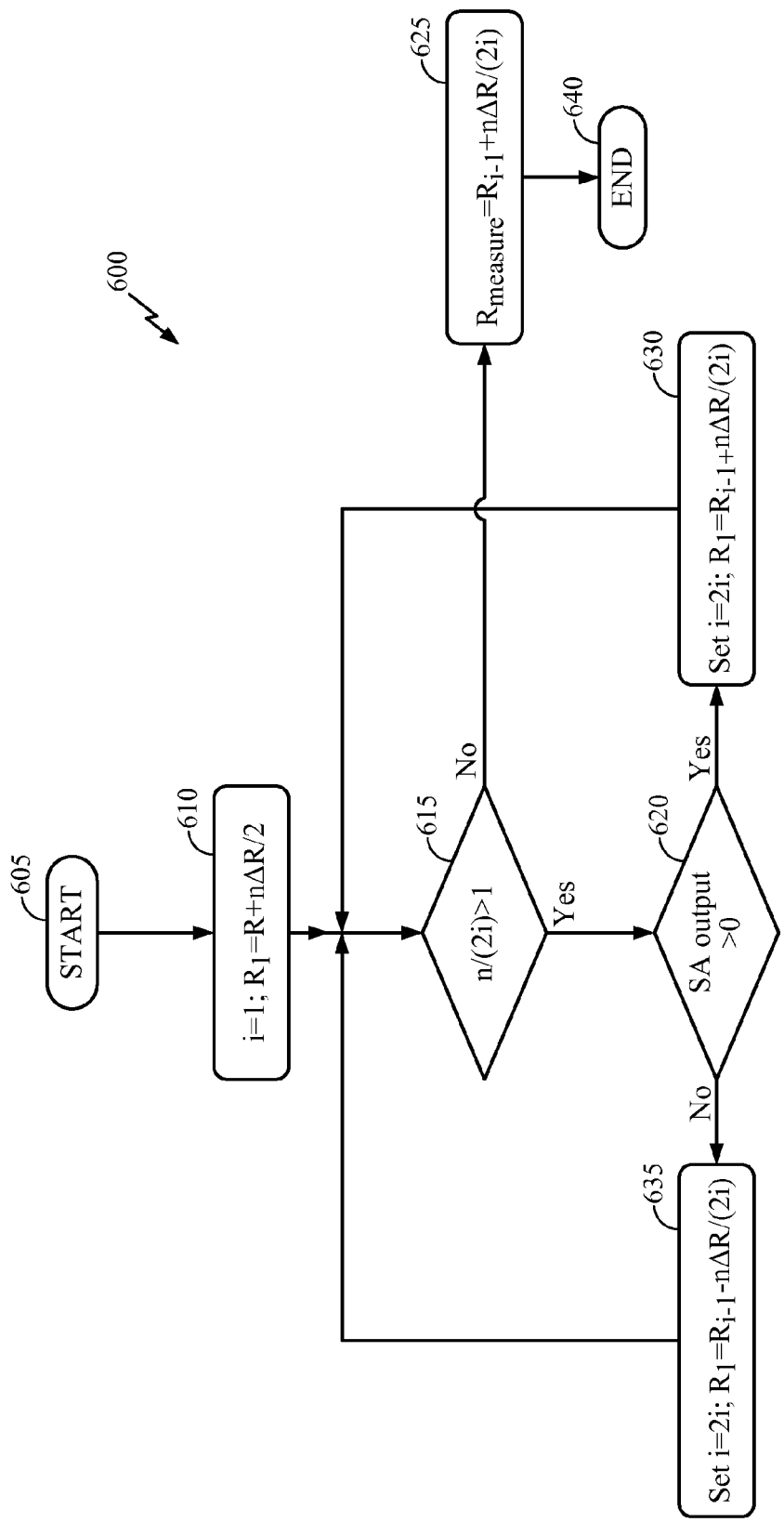
FIG. 6 depicts an exemplary flowchart of a method for testing a resistive memory element.

FIG. 6 depicts an exemplary flowchart of a method 600 for testing a resistive memory element. The method 600 for testing a resistive memory element can be performed at least in part by the apparatus described hereby. In an example, resistive memory element under test is the MTJ 105 and the method 600 can be used to determine the resistance ($R_{MTJ}$) of the MTJ 105. The method 600 can be executed, at least in part, by the controller 415 to generate the control vector 420 and control a resistance network, such as the logic-controlled resistance network 410. The method starts at start block 605.

At block 610, variable "i" is set to "1" and the resistance of the resistance network ($R_i$) is set to R+nΔR/2. The variable "n" is the number of possible resistances produced by the resistance network.

At decision block 615, a decision is made as to whether n/(2i)>1. If n/(2i)>1, then execution of the method 600 proceeds to block 620, if n/(2i)≤1, then execution of the method 600 proceeds to block 625.

At decision block 620, a decision is made as to whether an output of a sense amplifier, such as sense amplifier 405, is >0. If the output of the sense amplifier is >0, then execution of the method 600 proceeds to block 630. If the output of the sense amplifier is ≤0, then execution of the method 600 proceeds to block 635.

At block 625, the final measurement resistance ($R_{measure}$) of the resistance network is calculated as $R_{measure}=R_{i-1}+nΔR/(2i)$. The resistance ($R_{MTJ}$) of the MTJ 105 is then calculated as $R_{MTJ}=R_{measure}-R_t$. Execution of the method 600 then proceeds to end block 640.

At block 630, "i" is set to "2i" and the resistance of the resistance network ($R_i$) is set to $R_{i-1}+nΔR/(2i)$. Execution of the method 600 then proceeds to the input of the decision block 615.

At block 635, "i" is set to "2i" and the resistance of the resistance network ($R_i$) is set to $R_{i-1}+nΔR/(2i)$. Execution of the method 600 then proceeds to the input of the decision block 615.

Figure 7:
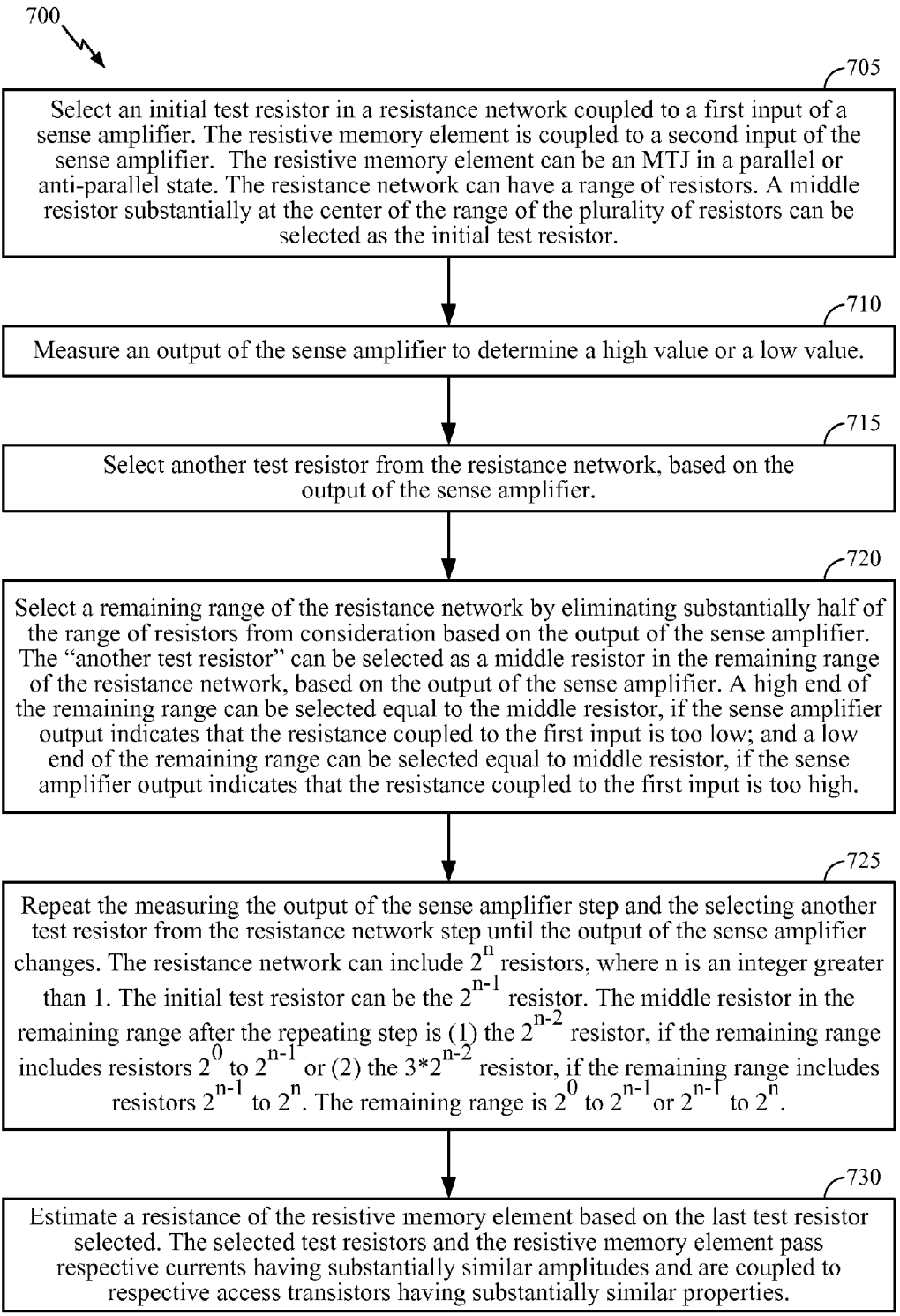
FIG. 7 depicts an exemplary method for testing a resistive memory element.

FIG. 7 depicts an exemplary method for testing a resistive memory element 700. The method for testing a resistive memory element can be performed at least in part by the apparatus described hereby. In an example, resistive memory element is the MTJ 105 and the method 700 can be used to determine the resistance ($R_{MTJ}$) of the MTJ 105. The method 700 can be executed, at least in part, by the controller 415 to generate the control vector 420 and control a resistance network, such as the logic-controlled resistance network 410.

In step 705, an initial test resistor in a resistance network coupled to a first input of a sense amplifier is selected. The resistive memory element is coupled to a second input of the sense amplifier. The resistive memory element can be an MTJ in a parallel or anti-parallel state. The resistance network can have a range of resistors. A middle resistor substantially at the center of the range of the plurality of resistors can be selected as the initial test resistor.

In step 710, an output of the sense amplifier is measured to determine a high value or low value.

In step 715, another test resistor from the resistance network is selected, based on the output of the sense amplifier.

In step 720, a remaining range of the resistance network is selected by eliminating substantially half of the range of resistors from consideration based on the output of the sense amplifier. The test resistor can be selected as a middle resistor in the remaining range of the resistance network, based on the output of the sense amplifier. The high end of the remaining range can be selected equal to the middle resistor, if the sense amplifier output indicates that the resistance coupled to the first input is too low; and the low end of the remaining range can be selected equal to middle resistor, if the sense amplifier output indicates that the resistance coupled to the first input is too high.

In step 725, the measuring the output of the sense amplifier step and the selecting another test resistor from the resistance network step are repeated until the output of the sense amplifier changes. The resistance network can include $2^n$ resistors, where n is an integer greater than 1. The initial test resistor can be the $2^{n-1}$ resistor. The middle resistor in the remaining range after the repeating step is (1) the $2^{n-2}$ resistor, if the remaining range includes resistors $2^0$ to $2^{n-1}$ or (2) the $3*2^{n-2}$ resistor, if the remaining range includes resistors $2^{n-1}$ to $2^n$. The remaining range is $2^0$ to $2^{n-1}$ or $2^{n-1}$ to $2^n$.

In step 730, a resistance of the resistive memory element is estimated, based on the last test resistor selected. The selected test resistors (e.g., the initial test resistor, the "another test resistor," the last test resistor selected, etc.) and the resistive memory element pass respective currents having substantially similar amplitudes and are coupled to respective access transistors having substantially similar properties.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Terni Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1xRTT, 1xEV-DO RelO, RevA, RevB) technology and other technologies. The techniques can be used in emerging and future networks and interfaces, including Long Term Evolution (LTE).

At least a portion of the methods, sequences and/or algorithms described in connection with the embodiments disclosed herein may be embodied directly in hardware, in a software module executed by a processor, or in a combination of the two. In an example, a processor includes multiple discrete hardware components. A software module may reside in RAM memory, flash memory, ROM memory, EPROM memory, EEPROM memory, registers, hard disk, a removable disk, a CD-ROM, and/or any other form of storage medium known in the art. An exemplary storage medium can be coupled to the processor such that the processor can read information from, and write information to, the storage medium. In an alternative, the storage medium may be integral with the processor.

Further, many embodiments are described in terms of sequences of actions to be performed by, for example, elements of a computing device. Various actions described herein can be performed by a specific circuit (e.g., an application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, a corresponding circuit of any such embodiments may be described herein as, for example, "logic configured to" perform a described action.

An embodiment of the invention can include a computer readable media embodying a method described herein. Accordingly, the invention is not limited to illustrated examples and any means for performing the functionality described herein are included in embodiments of the invention.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which are stored on a computer-readable media. The file can be provided to a fabrication handler who fabricates with a lithographic device, based on the file, an integrated device. In an example, the integrated device is on a semiconductor wafer. The semiconductor wafer can be cut into a semiconductor die and packaged into a semiconductor chip. The semiconductor chip can be employed in a device described herein (e.g., a mobile device).

Embodiments can include a machine-readable media and/or a computer-readable media embodying instructions which, when executed by a processor, transform a processor and any other cooperating devices into a machine for performing at least a part of a function described hereby.

Nothing stated or illustrated herein is intended to cause a dedication of any component, step, feature, object, benefit, advantage, or equivalent to the public, regardless of whether the component, step, feature, object, benefit, advantage, or the equivalent is recited in the claims.

While this disclosure describes exemplary embodiments of the invention, it should be noted that various changes and modifications could be made herein without departing from the scope of the invention as defined by the appended claims.

What is claimed is:

1. A method for testing a resistive memory element, comprising:
    selecting an initial test resistor in a resistance network coupled to a first input of a sense amplifier, wherein the resistive memory element is coupled to a second input of the sense amplifier;
    measuring an output of the sense amplifier to determine a high value or low value;
    selecting another test resistor from the resistance network based on the output of the sense amplifier;
    repeating the measuring the output of the sense amplifier step and the selecting another test resistor from the resistance network step, until the output of the sense amplifier changes; and
    estimating a resistance of the resistive memory element based on a last test resistor selected, wherein the initial test resistor and the resistive memory element pass respective currents having substantially similar amplitudes and are coupled to respective access transistors having substantially similar properties.

2. The method of claim 1, wherein the resistive memory element is a magnetic tunnel junction (MTJ).

3. The method of claim 2, wherein the MTJ is in a parallel state.

4. The method of claim 2, wherein the MTJ is in an anti-parallel state.

5. The method of claim 1, wherein the resistance network has a range of resistors, and a middle resistor substantially at the center of the range of resistors is selected as the initial test resistor.

6. The method of claim 5, further comprising selecting a remaining range of the resistance network by eliminating substantially half of the range of resistors from consideration in the selecting another test resistor step based on the output of the sense amplifier, wherein the another test resistor is selected as the middle resistor in the remaining range of the resistance network, based on the output of the sense amplifier.

7. The method of claim 6, wherein:
    the resistance network includes $2^n$ resistors, where n is an integer greater than 1;
    the initial test resistor is a $2^{n-1}$ resistor; and
    the middle resistor in the remaining range after the repeating step is (1) a $2^{n-2}$ resistor, if the remaining range includes resistors $2^0$ to $2^{n-1}$ or (2) a $3*2^{n-2}$ resistor, if the remaining range includes resistors $2^{n-1}$ to $2^n$; and the remaining range is $2^0$ to $2^{n-1}$ or $2^{n-1}$ to $2^n$.

8. The method of claim 6, wherein the selecting the remaining range comprises at least one of:
    selecting a high end of the remaining range equal to the middle resistor, if the sense amplifier output indicates that the resistance coupled to the first input is too low; and
    selecting a low end of the remaining range equal to the middle resistor, if the sense amplifier output indicates that the resistance coupled to the first input is too high.

9. An apparatus configured to test a resistance of a magnetic tunnel junction, comprising:
    means for selecting an initial test resistor in a resistance network coupled to a first input of a sense amplifier, wherein a resistive memory element is coupled to a second input of the sense amplifier;
    means for measuring an output of the sense amplifier to determine a high value or low value;
    means for selecting another test resistor from the resistance network based on the output of the sense amplifier;
    means for repeating actuation of the means for measuring the output of the sense amplifier and the means for selecting another test resistor from the resistance network, until the output of the sense amplifier changes; and
    means for estimating a resistance of the resistive memory element based on a last test resistor selected, wherein the initial test resistor and the resistive memory element pass respective currents having substantially similar amplitudes and are coupled to respective access transistors having substantially similar properties.

10. The apparatus of claim 9, wherein the resistive memory element is a magnetic tunnel junction (MTJ).

11. The apparatus of claim 10, wherein the MTJ is in a parallel state.

12. The apparatus of claim 10, wherein the MTJ is in an anti-parallel state.

13. The apparatus of claim 9, wherein the resistance network has a range of resistors, and a middle resistor substantially at the center of the range of resistors is selected as the initial test resistor.

14. The apparatus of claim 13, further comprising means for selecting a remaining range of the resistance network by eliminating substantially half of the range of resistors from consideration by the means for selecting another test resistor based on the output of the sense amplifier, wherein the another test resistor is selected as the middle resistor in the remaining range of the resistance network, based on the output of the sense amplifier.

15. The apparatus of claim 14, wherein;
    the resistance network includes $2^n$ resistors, n is an integer greater than 1;
    the initial test resistor is a $2^{n-1}$ resistor; and
    the middle resistor in the remaining range output from the means for repeating is (1) a $2^{n-2}$ resistor, if the remaining range includes resistors $2^0$ to $2^{n-1}$ or (2) a $3*2^{n-2}$ resistor, if the remaining range includes resistors $2^{n-1}$ to $2^n$; and the remaining range is $2^0$ to $2^{n-1}$ or $2^{n-1}$ to $2^n$.

16. The apparatus of claim 14, wherein the selecting the remaining range comprises at least one of:
    means for selecting a high end of the remaining range equal to the middle resistor, if the sense amplifier output indicates that the resistance coupled to the first input is too low; and
    means for selecting a low end of the remaining range equal to the middle resistor, if the sense amplifier output indicates that the resistance coupled to the first input is too high.

17. The apparatus of claim 9, wherein at least a part of the apparatus is integrated on a semiconductor die.

18. The apparatus of claim 9, wherein at least a part of the apparatus is integrated with a lithographic apparatus.

19. An apparatus configured to test a resistance of a magnetic tunnel junction, comprising a processor configured to:
    select an initial test resistor in a resistance network coupled to a first input of a sense amplifier, wherein a resistive memory element is coupled to a second input of the sense amplifier;
    measure an output of the sense amplifier to determine a high value or low value;
    select another test resistor from the resistance network based on the output of the sense amplifier;
    repeat the measuring the output of the sense amplifier step and the selecting another test resistor from the resistance network step, until the output of the sense amplifier changes; and estimate resistance of the resistive memory element based on a last test resistor selected, wherein the initial test resistor and the resistive memory element pass respective currents having substantially similar amplitudes and are coupled to respective access transistors having substantially similar properties.

20. The apparatus of claim 19, wherein the resistive memory element is a magnetic tunnel junction (MTJ).

21. The apparatus of claim 20, wherein the MTJ is in a parallel state.

22. The apparatus of claim 20, wherein the MTJ is in an anti-parallel state.

23. The apparatus of claim 19, wherein the resistance network has a range of resistors, and a middle resistor substantially at the center of the range of resistors is selected as the initial test resistor.

24. The apparatus of claim 23, wherein the processor is further configured to select a remaining range of the resistance network by eliminating substantially half of the range of resistors from consideration in the selecting another test resistor step based on the output of the sense amplifier, and the another test resistor is selected as the middle resistor in the remaining range of the resistance network, based on the output of the sense amplifier.

25. The apparatus of claim 24, wherein:
the resistance network includes $2^n$ resistors, n is an integer;
the initial test resistor is a $2^{n-1}$ resistor; and
the middle resistor in the remaining range after the repeating step is (1) a $2^{n-2}$ resistor, if the remaining range includes resistors $2^0$ to $2^{n-1}$ or (2) a $3*2^{n-2}$ resistor, if the remaining range includes resistors $2^{n-1}$ to $2^n$; and the remaining range is $2^0$ to $2^{n-1}$ or $2^{n-1}$ to $2^n$.

26. The apparatus of claim 24, wherein the selecting the remaining range comprises at least one of:
selecting a high end of the remaining range equal to the middle resistor, if the sense amplifier output indicates that the resistance coupled to the first input is too low; and
selecting a low end of the remaining range equal to the middle resistor, if the sense amplifier output indicates that the resistance coupled to the first input is too high.

27. The apparatus of claim 19, wherein at least a part of the apparatus is integrated on a semiconductor die.

28. The apparatus of claim 19, wherein at least a part of the apparatus is integrated with a lithographic apparatus.

29. A non-transitory computer-readable medium, comprising instructions stored thereon that, if executed by a processor, cause the processor to execute a method comprising:
selecting an initial test resistor in a resistance network coupled to a first input of a sense amplifier, wherein a resistive memory element is coupled to a second input of the sense amplifier;
measuring an output of the sense amplifier to determine a high value or low value;
selecting another test resistor from the resistance network based on the output of the sense amplifier;
repeating the measuring the output of the sense amplifier step and the selecting another test resistor from the resistance network step, until the output of the sense amplifier changes; and
estimating a resistance of the resistive memory element based on a last test resistor selected, wherein the initial test resistor and the resistive memory element pass respective currents having substantially similar amplitudes and are coupled to respective access transistors having substantially similar properties.

30. The non-transitory computer-readable medium of claim 29, wherein the resistive memory element is a magnetic tunnel junction (MTJ).

31. The non-transitory computer-readable medium of claim 30, wherein the MTJ is in a parallel state.

32. The non-transitory computer-readable medium of claim 30, wherein the MTJ is in an anti-parallel state.

33. The non-transitory computer-readable medium of claim 29, wherein the resistance network has a range of resistors, and a middle resistor substantially at the center of the range of resistors is selected as the initial test resistor.

34. The non-transitory computer-readable medium of claim 33, wherein the method further comprises selecting a remaining range of the resistance network by eliminating substantially half of the range of resistors from consideration in the selecting another test resistor step based on the output of the sense amplifier, and the another test resistor is selected as the middle resistor in the remaining range of the resistance network, based on the output of the sense amplifier.

35. The non-transitory computer-readable medium of claim 34, wherein:
the resistance network includes $2^{n-1}$ resistors, where n is an integer greater than 1;
the initial test resistor is a $2^{n-1}$ resistor; and
the middle resistor in the remaining range after the repeating step is (1) a $2^{n-2}$ resistor, if the remaining range includes resistors $2^0$ to $2^{n-1}$ or (2) a $3*2^{n-2}$ resistor, if the remaining range includes resistors $2^{n-1}$ to $2^n$; and the remaining range is $2^0$ to $2^{n-1}$ or $2^{n-1}$ to $2^n$.

36. The non-transitory computer-readable medium of claim 34, wherein the selecting the remaining range comprises at least one of:
selecting a high end of the remaining range equal to the middle resistor, if the sense amplifier output indicates that the resistance coupled to the first input is too low; and
selecting a low end of the remaining range equal to the middle resistor, if the sense amplifier output indicates that the resistance coupled to the first input is too high.

37. The non-transitory computer-readable medium of claim 29, wherein at least a part of the non-transitory computer-readable medium is integrated with a lithographic apparatus.

38. A method for testing a resistive memory element, comprising:
a step for selecting an initial test resistor in a resistance network coupled to a first input of a sense amplifier, wherein the resistive memory element is coupled to a second input of the sense amplifier;
a step for measuring an output of the sense amplifier to determine a high value or low value;
a step for selecting another test resistor from the resistance network based on the output of the sense amplifier;
a step for repeating the step for measuring the output of the sense amplifier and the step for selecting another test resistor from the resistance network step, until the output of the sense amplifier changes; and
a step for estimating a resistance of the resistive memory element based on a last test resistor selected, wherein the initial test resistor and the resistive memory element pass respective currents having substantially similar amplitudes and are coupled to respective access transistors having substantially similar properties.

39. The method of claim 38, wherein the resistive memory element is a magnetic tunnel junction (MTJ).

40. The method of claim 39, wherein the MTJ is in a parallel state.

41. The method of claim 39, wherein the MTJ is in an anti-parallel state.

42. The method of claim 38, wherein the resistance network has a range of resistors, and a middle resistor substantially at the center of the range of resistors is selected as the initial test resistor.

43. The method of claim 42, further comprising a step for selecting a remaining range of the resistance network by eliminating substantially half of the range of resistors from consideration in the selecting another test resistor step based on the output of the sense amplifier, wherein the another test resistor is selected as the middle resistor in the remaining range of the resistance network, based on the output of the sense amplifier.

44. The method of claim 43, wherein:
the resistance network includes $2^n$ resistors, where n is an integer greater than 1;
the initial test resistor is a $2^{n-1}$ resistor; and
the middle resistor in the remaining range after the repeating step is (1) a $2^{n-2}$ resistor, if the remaining range includes resistors $2^0$ to $2^{n-1}$ or (2) a $3*2^{n-2}$ resistor, if the remaining range includes resistors $2^{n-1}$ to $2^n$; and the remaining range is $2^0$ to $2^{n-1}$ or $2^{n-1}$ to $2^n$.

45. The method of claim 43, wherein the step for selecting the remaining range farther comprises at least one of:
a step for selecting a high end of the remaining range equal to the middle resistor, if the sense amplifier output indicates that the resistance coupled to the first input is too low; and
a step for selecting a low end of the remaining range equal to the middle resistor, if the sense amplifier output indicates that the resistance coupled to the first input is too high.

* * * * *